United States Patent
Ando et al.

(10) Patent No.: US 9,583,486 B1
(45) Date of Patent: Feb. 28, 2017

(54) STABLE WORK FUNCTION FOR NARROW-PITCH DEVICES

(71) Applicant: INTERNATIONAL BUSINESS MACHINES CORPORATION, Armonk, NY (US)

(72) Inventors: Takashi Ando, Tuckahoe, NY (US); Mohit Bajaj, Karnatake (IN); Terence B. Hook, Jericho, VT (US); Rajan K. Pandey, Karnataka (IN); Rajesh Sathiyanarayanan, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/946,245

(22) Filed: Nov. 19, 2015

(51) Int. Cl.
| | |
|---|---|
| *H01L 27/08* | (2006.01) |
| *H01L 29/49* | (2006.01) |
| *H01L 29/51* | (2006.01) |
| *H01L 27/088* | (2006.01) |
| *H01L 29/423* | (2006.01) |
| *H01L 21/8234* | (2006.01) |

(52) U.S. Cl.
CPC .. *H01L 27/0886* (2013.01); *H01L 21/823431* (2013.01); *H01L 21/823437* (2013.01); *H01L 29/42372* (2013.01); *H01L 29/4966* (2013.01); *H01L 29/517* (2013.01)

(58) Field of Classification Search
CPC .......... H01L 27/0886; H01L 29/42372; H01L 29/4966; H01L 29/517
See application file for complete search history.

(56) References Cited

U.S. PATENT DOCUMENTS

| | | | |
|---|---|---|---|
| 6,800,885 B1 | 10/2004 | An et al. | |
| 7,528,025 B2* | 5/2009 | Brask | H01L 21/845 |
| | | | 438/183 |
| 7,608,890 B2 | 10/2009 | Yagishita | |
| 7,678,632 B2 | 3/2010 | Gossner et al. | |
| 8,669,615 B1 | 3/2014 | Chang et al. | |
| 8,765,546 B1 | 7/2014 | Hung et al. | |
| 9,018,054 B2 | 4/2015 | Yoshida et al. | |
| 9,087,918 B2* | 7/2015 | Chambers | H01L 21/28088 |
| 9,196,696 B2* | 11/2015 | Xie | H01L 29/4958 |
| 9,431,496 B2* | 8/2016 | Kang | H01L 29/4236 |
| 9,443,771 B1* | 9/2016 | Shen | H01L 21/82382 |
| 2009/0149012 A1* | 6/2009 | Brask | H01L 21/845 |
| | | | 438/595 |
| 2010/0155849 A1* | 6/2010 | Liu | H01L 21/28194 |
| | | | 257/369 |
| 2011/0291188 A1 | 12/2011 | Cheng et al. | |
| 2012/0056265 A1 | 3/2012 | Liang et al. | |
| 2014/0151814 A1* | 6/2014 | Giles | H01L 21/82382 |
| | | | 257/369 |

(Continued)

*Primary Examiner* — Ida M Soward
(74) *Attorney, Agent, or Firm* — Tutunjian & Bitetto, P.C.; Vazken Alexanian

(57) ABSTRACT

A work function setting metal stack includes a configuration of layers including a high dielectric constant layer and a diffusion prevention layer formed on the high dielectric constant layer. An aluminum doped TiC layer has a thickness greater than 5 nm wherein the configuration of layers is employed between two regions as a diffusion barrier to prevent mass diffusion between the two regions.

8 Claims, 10 Drawing Sheets

(56) References Cited

U.S. PATENT DOCUMENTS

| | | | |
|---|---|---|---|
| 2014/0239419 A1* | 8/2014 | Chen | H01L 29/401 257/411 |
| 2014/0264481 A1* | 9/2014 | Hung | H01L 23/485 257/288 |
| 2014/0264572 A1 | 9/2014 | Kim et al. | |
| 2014/0306273 A1* | 10/2014 | Ho | H01L 21/28088 257/288 |
| 2015/0194433 A1 | 7/2015 | Ponoth et al. | |
| 2015/0255458 A1* | 9/2015 | Ando | H01L 29/517 257/401 |
| 2015/0255469 A1* | 9/2015 | Choi | H01L 27/11206 257/379 |
| 2015/0371872 A1* | 12/2015 | Foster | H01L 21/32134 438/754 |

\* cited by examiner

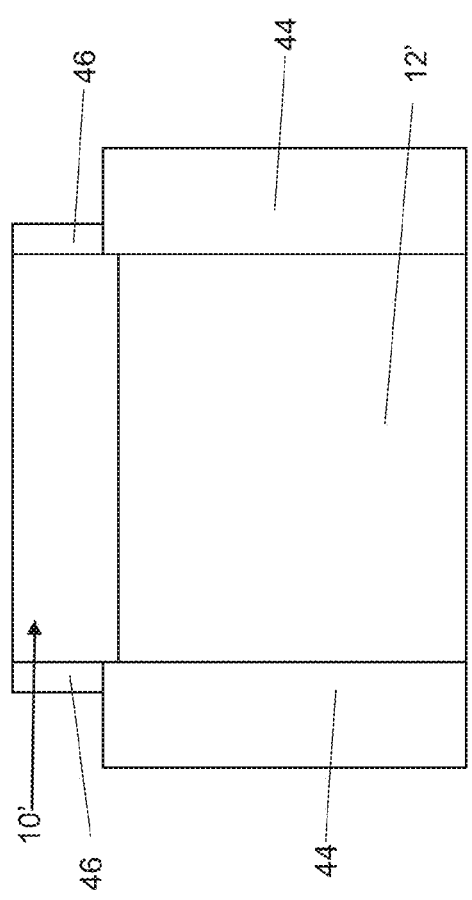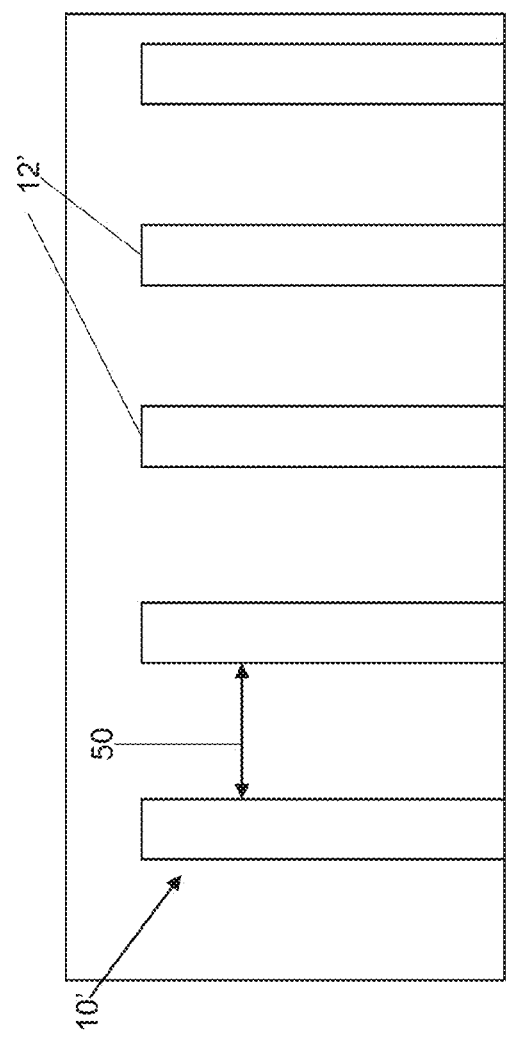

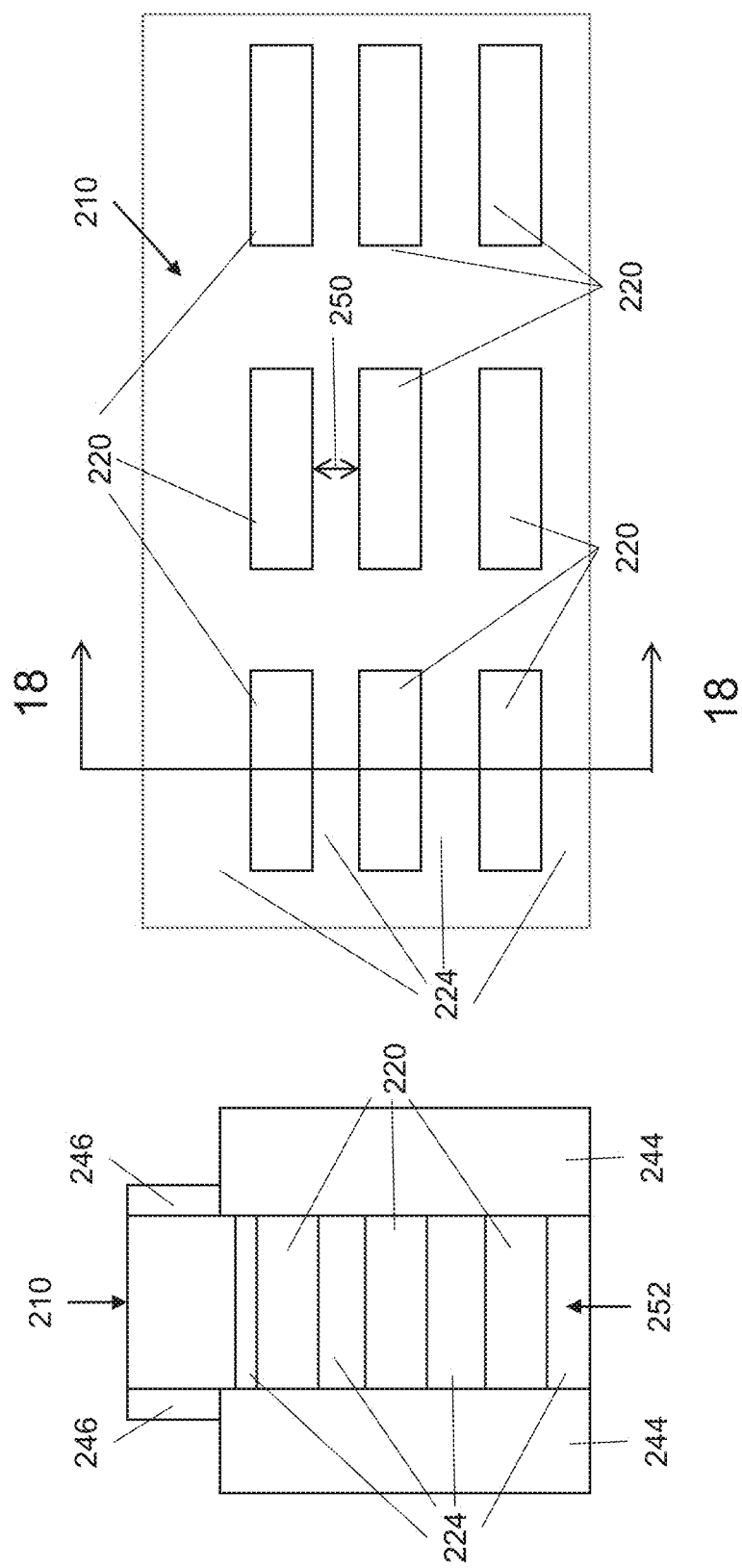

US 9,583,486 B1

STABLE WORK FUNCTION FOR NARROW-PITCH DEVICES

BACKGROUND

Technical Field

The present invention relates to semiconductor devices, and more particularly to devices and methods for fabricating such devices with work function setting metal layers, which are more compatible with narrower spaces between semiconductor regions.

Description of the Related Art

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of the device size scaling. With narrower gaps, it becomes more important to prevent oxygen diffusion between and into these narrow structures. In one example, a gate structure that permits oxygen diffusion into the gate dielectric can experience detrimental threshold voltage changes.

While finFETs and/or nanosheets can benefit from tight device-device spacing, these dimensions may limit scaling of these devices. Further, devices requiring thicker dielectric for higher voltage operation are even more severely limited in the allowable dimensions.

SUMMARY

A work function setting metal stack includes a configuration of layers including a high dielectric constant layer and a diffusion prevention layer formed on the high dielectric constant layer and an aluminum doped TiC layer with a thickness greater than 5 nm formed on the diffusion prevention layer. The configuration of layers is employed between two regions as a diffusion barrier to prevent mass diffusion between the two regions.

A field effect transistor structure includes a plurality of fins structures. A gate structure is disposed over and between the fin structures. The gate structure includes a gate dielectric layer; a diffusion prevention layer formed on the gate dielectric; and a continuous aluminum doped TiC layer having a thickness greater than 5 nm. The aluminum doped TiC layer is formed on the diffusion prevention layer and is formed by pinching off portions of the aluminum doped TiC layer (during deposition) within the diffusion prevention layer to merge the portions without intervening layers between the portions. Source and drain regions are formed on sides of the gate structure on the plurality of fin structures.

A method for forming a field effect transistor includes forming a gate dielectric layer over and between a plurality of fins; depositing a single diffusion prevention layer on the gate dielectric; depositing a TiAlC layer having a thickness greater than 5 nm on the diffusion prevention layer by pinching off portions of the TiAlC layer within the diffusion prevention layer to merge the portions without intervening layers between the portions; and forming source and drain regions on sides of the gate structure on the plurality of fin structures.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view taken at section line 5-5 of FIG. 2 showing a gate structure with a thicker interface layer formed on a fin in accordance with the present principles;

FIG. 6 is a cross-sectional view taken at section line 6-6 of FIG. 2 showing a gate structure with a thicker interface layer formed on fins in accordance with the present principles;

FIG. 15 is a cross-sectional view taken at section line 15-15 of FIGS. 13 and 14 showing a gate structure formed on nanosheet fins in accordance with the present principles;

FIG. 16 is a cross-sectional view taken at section line 16-16 of FIGS. 13 and 14 showing a gate structure formed on nanosheet fins in accordance with the present principles;

DETAILED DESCRIPTION

Figure 2:
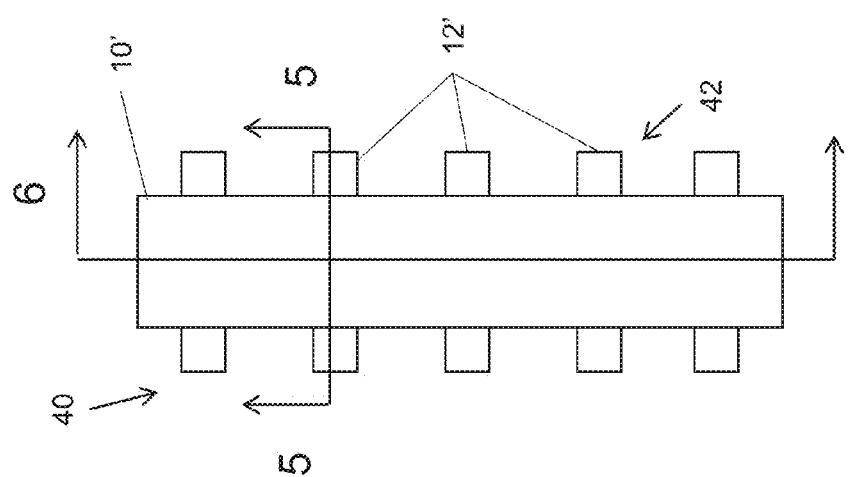
FIG. 2 is a top view showing a gate structure formed over fins with a thicker interface layer in accordance with the present principles.

In accordance with the present principles, layer stacks are provided for formation between semiconductor structures in narrow gaps. A number of layers employed to effectively provide a diffusion barrier is reduced as well as a thickness of a barrier structure between the semiconductor structures. Conventional designs with a full stack of layers on each conducting interface limit the permissible spacing. The present principles open up these limitations to permit additional device scaling to further reduce device sizes.

In one embodiment, a work function setting metal stack of TiN/TiAlC/TiN is reduced to TiN/TiAlC or other oxygen absorbing materials by merging the TiAlC layers grown from two opposing regions. The merged TiAlC layer reduces the needed thickness of the work function setting metal stack, which permits further scaling of a gate width, fin spacing, nanosheet spacing, among other structures. By employing merged TiAlC, oxygen is absorbed more effectively permitting elimination of one of the TiN layers and even permitting further reduction of the gate width, fin spacing, nanosheet spacing, etc.

The present principles will be illustratively described in accordance with two examples. These examples include fin field effect transistors (finFETs) and nanosheet fin structures. These examples are not limiting as the present principles can be employed in any scenario or structure and yield the benefits as described herein. By merging functions of layers and filling spaces between adjacent field effect transistor (FET) surfaces, an effective work function setting layer may be created without the need for additional barrier layers. In addition, the thicknesses of the layers in the stacks, in accordance with the present principles, provide a sufficient barrier to ensure work function stability within the needed dimensional limits.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., TiN, TiAlC, etc. These compounds include different proportions of the elements within the compound. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
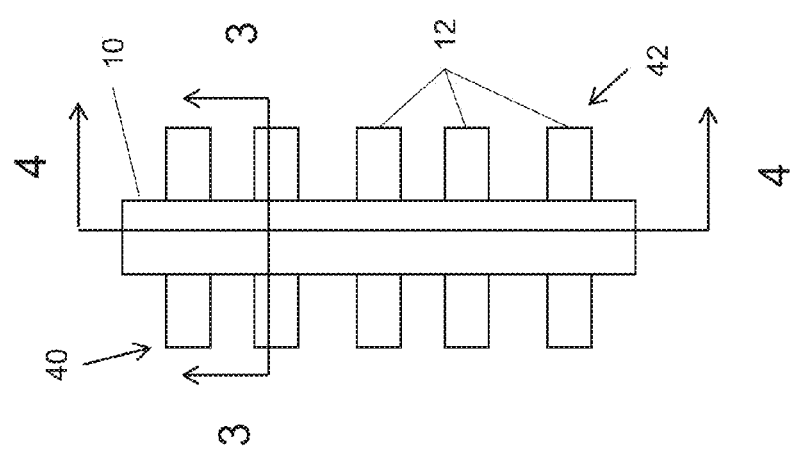
FIG. 1 is a top view showing a gate structure formed over fins in accordance with the present principles.

Referring now to the drawings in which like numerals represent the same or similar elements and initially to FIG. 1, a top view of a gate structure 10 running transversely over fins 12 is shown in accordance with one illustrative embodiment. The fins 12 may include Si, SiGe, or other semiconductor materials. The gate structure 10 in this example runs over fins 12 and is disposed between the fins 12. The gate structure 10 forms a high-performance device with tight fin pitch and a short gate. Source and drains regions are formed in areas 40 and 42, adjacent to the gate structure 10.

Referring to FIG. 2, a top view of a gate structure 10' running transversely over fins 12' is shown in accordance with another illustrative embodiment. The fins 12 may include Si, SiGe, or other semiconductor materials. The gate structure 10' in this example is wider to accommodate thicker dielectric layers to handle larger voltages. In addition, higher voltage devices need a wider fin pitch and longer gate to accommodate the thicker dielectric layers. Source and drain regions are formed in areas 40 and 42, adjacent to the gate structure 10'.

Figure 3:
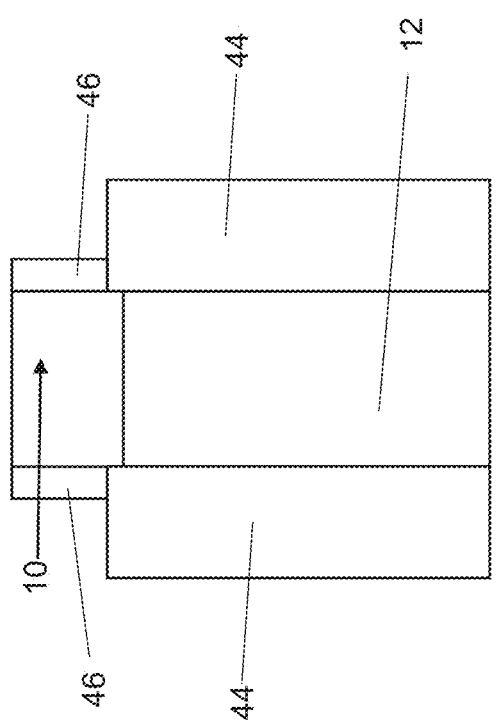
FIG. 3 is a cross-sectional view taken at section line 3-3 of FIG. 1 showing a gate structure formed on a fin in accordance with the present principles.

Referring to FIG. 3, a cross-sectional view taken at section line 3-3 in FIG. 1 is shown in accordance with one illustrative embodiment. The gate structure 10 includes spacers 46 thereon. The gate structure 10 includes a number of layers therein. These layers include dielectric layers, work function metals, main conductors, etc. depending on the design. The gate structure 10 is formed between source and drain regions 44, which are formed adjacent to the gate structure 10. Source and drain regions 44 may be formed by an epitaxial growth process over end portions of the fins 12.

Figure 4:
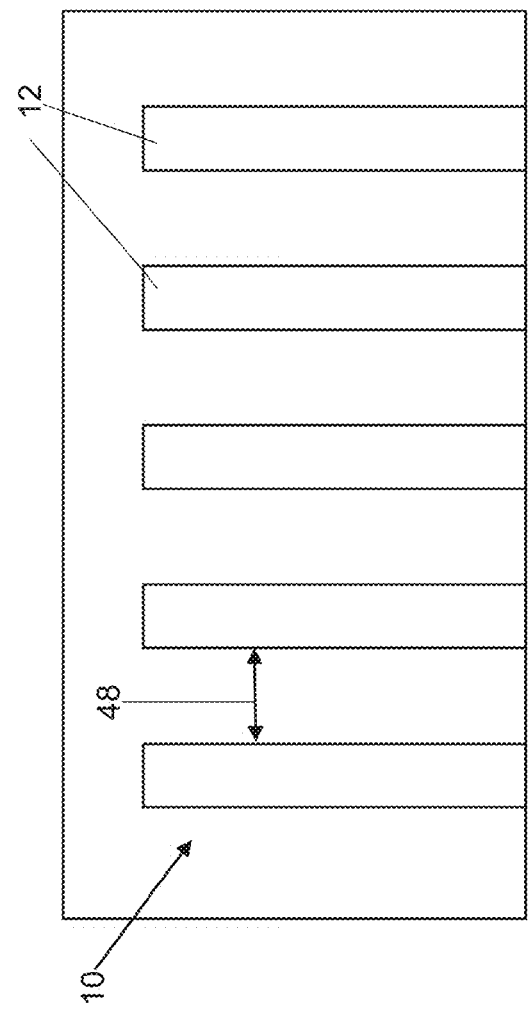
FIG. 4 is a cross-sectional view taken at section line 4-4 of FIG. 1 showing a gate structure formed on fins in accordance with the present principles.

Referring to FIG. 4, a cross-sectional view taken at section line 4-4 in FIG. 1 is shown in accordance with one illustrative embodiment. The gate structure 10 is shown passing over and in between the fins 12. The gate structure 10 is illustratively shown without a layer stack for simplicity and to show that the gate stack layers are disposed in regions 48 between fins 12.

Referring to FIG. 5, a cross-sectional view taken at section line 5-5 in FIG. 2 is shown in accordance with one illustrative embodiment. The gate structure 10' includes spacers 46 thereon. The gate structure 10' includes a number of layers therein. These layers include dielectric layers, work function metals, main conductors, etc. depending on the design. The gate structure 10' is formed between source and drain regions 44, which are formed adjacent to the gate structure 10'. Source and drain regions 44 may be formed by an epitaxial growth process over end portions of the fins 12'.

In this embodiment, the gate structures 10' are wider to accommodate thicker dielectric material to handle a larger gate voltage. The gate structure 10' is longer and the fins 12' are spaced apart wider than depicted in FIGS. 3 and 4.

Referring to FIG. 6, a cross-sectional view taken at section line 6-6 in FIG. 2 is shown in accordance with one illustrative embodiment. The gate structure 10' is shown passing over and in between the fins 12'. The gate structure 10' is illustratively shown without a layer stack for simplicity and to show that the gate stack layers are disposed in regions 50 between fins 12'. Regions 50 have a larger dimension than regions 48 to accommodate additional dielectric materials for handling increased voltage.

Figure 7:
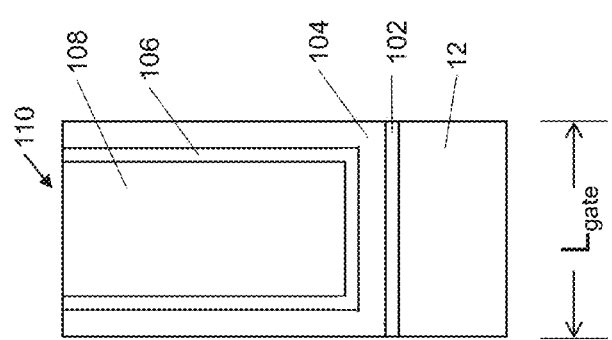
FIG. 7 is a cross-sectional view showing the gate structure of FIG. 3 in greater detail in accordance with the present principles.

Referring to FIG. 7, a cross-sectional view of the gate structure 10 is illustratively shown in greater detail for one embodiment. The gate structure or stack 10 is included between spacers 46 (not shown in FIG. 7). The gate structure 10 is formed on fin 12. The fin 12 includes an interface layer 102, which is grown on or deposited on the fin 12. The interface layer (IL) 102 may include an oxide or an oxynitride. A high dielectric constant (high-k) dielectric material 104 is formed over the IL 102 and over sidewalls (spacers 46, FIG. 3). The high-k dielectric layer 104 and the IL 102 form the gate dielectric for the gate structure 10.

A diffusion barrier layer 106 is formed on the high-k dielectric layer 104. The diffusion barrier may include TiN, although other materials may be employed, such as, e.g., TaN, etc. A work function setting material 108 is formed on the diffusion barrier layer 106. A main conductor (not shown) may be formed on or within the work function setting material 108. The main conductor may include materials, such as W, Al, or other highly conductive materials.

In accordance with the present principles, for narrow-pitch devices, the work function setting material 108 includes TiAlC or TiC doped with Al. The work function setting material 108 works with the diffusion barrier layer 106 to prevent oxygen diffusion into the gate region. By preventing oxygen mobility, the work function setting material 108 remains stable and therefore, the threshold voltage remains stable.

The gate structure 10 employing the illustrative structure depicted in FIG. 7 provides equivalent or better performance than a TiN/TiAlC/TiN stack and includes a reduced gate length ($L_{gate}$). In accordance with the present principles, no TiN layer is employed to separate the work function setting material 108. The work function setting material 108 may be deposited in the gate structure and permitted to pinch off. In this way, the work function setting material 108 saves space and maintains its diffusion barrier properties.

Figure 8:
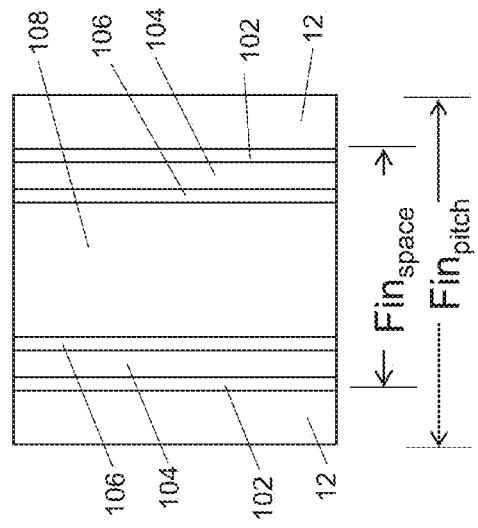
FIG. 8 is a cross-sectional view showing the gate structure of FIG. 3 between fins in greater detail in accordance with the present principles.

Referring to FIG. 8, region 48 of FIG. 4 is shown in greater detail. The layers of the gate structure 10 are also formed between fins 12. The fins 12 include the interface layer 102 on each fin 12. The fins 12 include the high-k dielectric material 104, the diffusion barrier layer 106 and the work function setting material 108. These layers 102, 104, 106 and 108 fit between fins 12 such that a minimum fin space ($Fin_{space}$) dimension needs to be provided. The $Fin_{space}$ along with the fin width provides a $Fin_{pitch}$.

Figure 9:
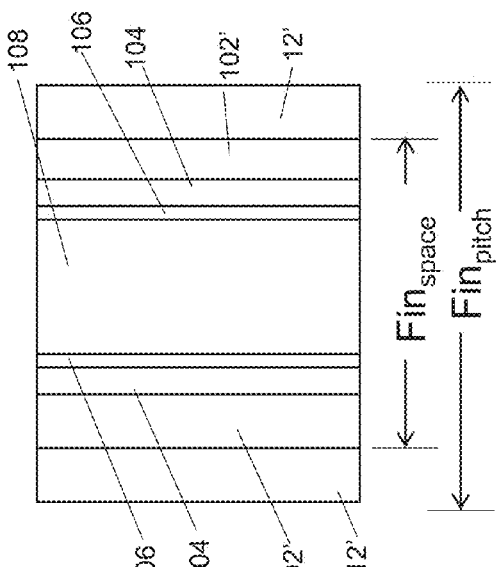
FIG. 9 is a cross-sectional view showing the gate structure of FIG. 5 between fins with a thicker interface layer in greater detail in accordance with the present principles.

Referring to FIG. 9, region 50 of FIG. 5 is shown in greater detail. The layers of the gate structure 10' are also formed between fins 12'. The fins 12' include the interface layer 102' on each fin 12. The interface layer 102' includes a thicker dimension to handle a larger gate voltage. The fins 12' also include the high-k dielectric material 104, the diffusion barrier layer 106 and the work function setting material 108. These layers 102', 104, 106 and 108 fit between fins 12' such that a minimum fin space ($Fin_{space}$) dimension needs to be provided. The $Fin_{space}$ is increased with the increased size of IL 102'. The $Fin_{space}$ being larger also affects the $Fin_{pitch}$, which becomes larger than the $Fin_{pitch}$ in FIG. 8.

Figure 10:
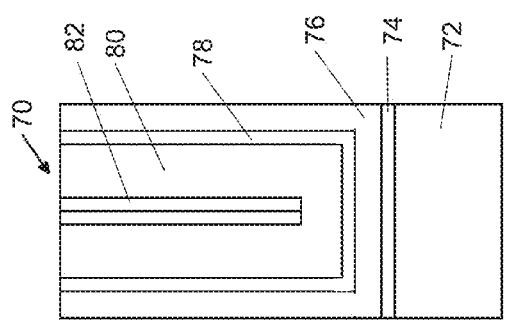
FIG. 10 is a cross-sectional view showing a gate structure using a TiN/TiAlC/TiN diffusion system.

Referring to FIG. 10, a cross-sectional view of a gate structure 60 is illustratively shown for a TiN/TiAlC/TiN structure for comparison. The gate structure 70 (spacers not shown) is formed on a fin 72. The fin 72 includes an interface layer 74, which is grown on or deposited on the fin 72. A high dielectric constant (high-k) dielectric material 76 is formed. A first TiN layer 78, a TiAlC layer 80 and a second TiN layer 82 are formed. These layers accumulate to determine the minimum allowed thickness ($L_{gate}$). In one example, $L_{gate}$=(thickness of layer 76 (e.g., 1.5 nm)+thickness of layer 78 (e.g., 1 nm)+thickness of layer 80 (e.g., 3 nm)+thickness of the layer 82 (e.g., 1 nm)) times 2=13 nm.

Figure 11:
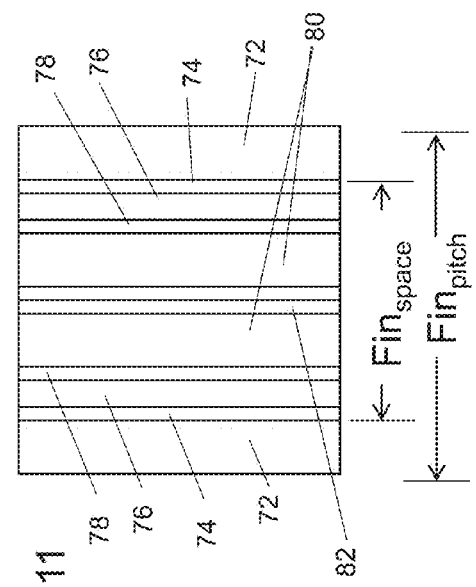
FIG. 11 is a cross-sectional view showing the TiN/TiAlC/TiN structure between fins in greater detail in accordance with the present principles.

Referring to FIG. 11 with continued reference to FIG. 10, these layers 74, 76, 78, 80, 82 are also placed between adjacent fins 72 (see, e.g., region 48). Then, $Fin_{space}$ includes $L_{gate}$ plus 2 times the thickness the interface layer (IL) 74. Therefore, $Fin_{space}$=(thickness of layer 74 (e.g., 0.5 nm)+ thickness of layer 76 (e.g., 1.5 nm)+thickness of layer 78 (e.g., 1 nm)+thickness of layer 80 (e.g., 3 nm)+thickness of the layer 82 (e.g., 1 nm)) times 2. In this example, $Fin_{space}$=14 nm. The $Fin_{pitch}$ is the pitch between fins 72. An additional 8 nm is added to account for a fin width. Therefore, the $Fin_{pitch}$=14 nm+8 nm=22 nm.

Figure 12:
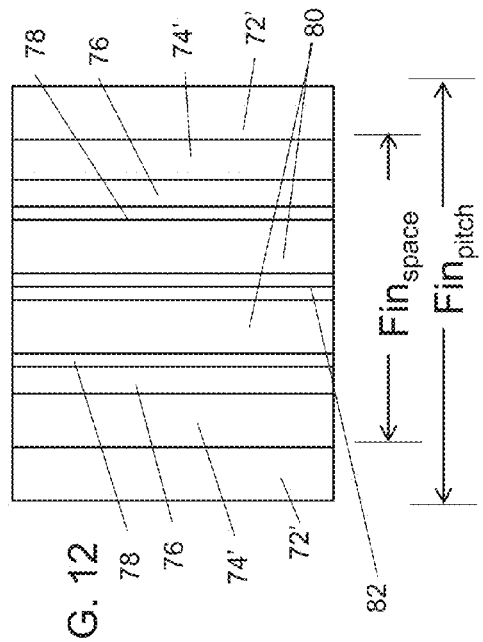
FIG. 12 is a cross-sectional view showing the TiN/TiAlC/TiN structure between fins with a thicker interface layer in greater detail in accordance with the present principles.

Referring to FIG. 12 with continued reference to FIG. 10, the IL layers 74 are larger and depicted as layers 74' formed on fins 72', which has a larger spacing and pitch. Then, $Fin_{space}$ includes $L_{gate}$ plus 2 times the thickness the interface layer (IL) 74'. Therefore, $Fin_{space}$=(thickness of layer 74' (e.g., 4 nm)+thickness of layer 76 (e.g., 1.5 nm)+thickness of layer 78 (e.g., 1 nm)+thickness of layer 80 (e.g., 3 nm)+thickness of the layer 82 (e.g., 1 nm)) times 2. In this example, $Fin_{space}$=21 nm. The $Fin_{pitch}$ is the pitch between fins 72'. An additional 8 nm is added to account from a fin width. Therefore, the $Fin_{pitch}$=21 nm+8 nm=29 nm.

In certain cases, the IL needs to be thicker for higher voltage applications. For example, instead of the interface layer 74 being 0.5 nm in thickness, it may be 4 nm in thickness. In such cases, $Fin_{space}$=21 nm and $Fin_{pitch}$=29 nm for the thicker oxide layer 74'.

A computation for finFETs in accordance with the present principles and the conventional structure provided the following results in Table 1.

TABLE 1

FinFET gate stack layer comparison

| | Dimensions in nm | | | |
|---|---|---|---|---|
| | Thin IL (102) | Thick oxide (102') | Thin IL (74) | Thick IL (74') |
| $L_{gate}$ | 10 | 10 | 13 | 13 |
| $Fin_{space}$ | 10 | 18 | 14 | 21 |
| $Fin_{pitch}$ | 18 | 26 | 22 | 29 |

As depicted in Table 1, significant reductions in size were obtained for the fin stack in accordance with the present principles (with IL 102, 102') over the stack shown in FIGS. 10-12 (with IL 74, 74'). Similar benefits can be obtained for different structures as well. For example, device employing nanosheets may also include a reduction in size with an improvement in the reduction of oxygen diffusion. Nanosheets are employed in a stack of nanosheets and may include multiple sheets.

Figures 13, 14:
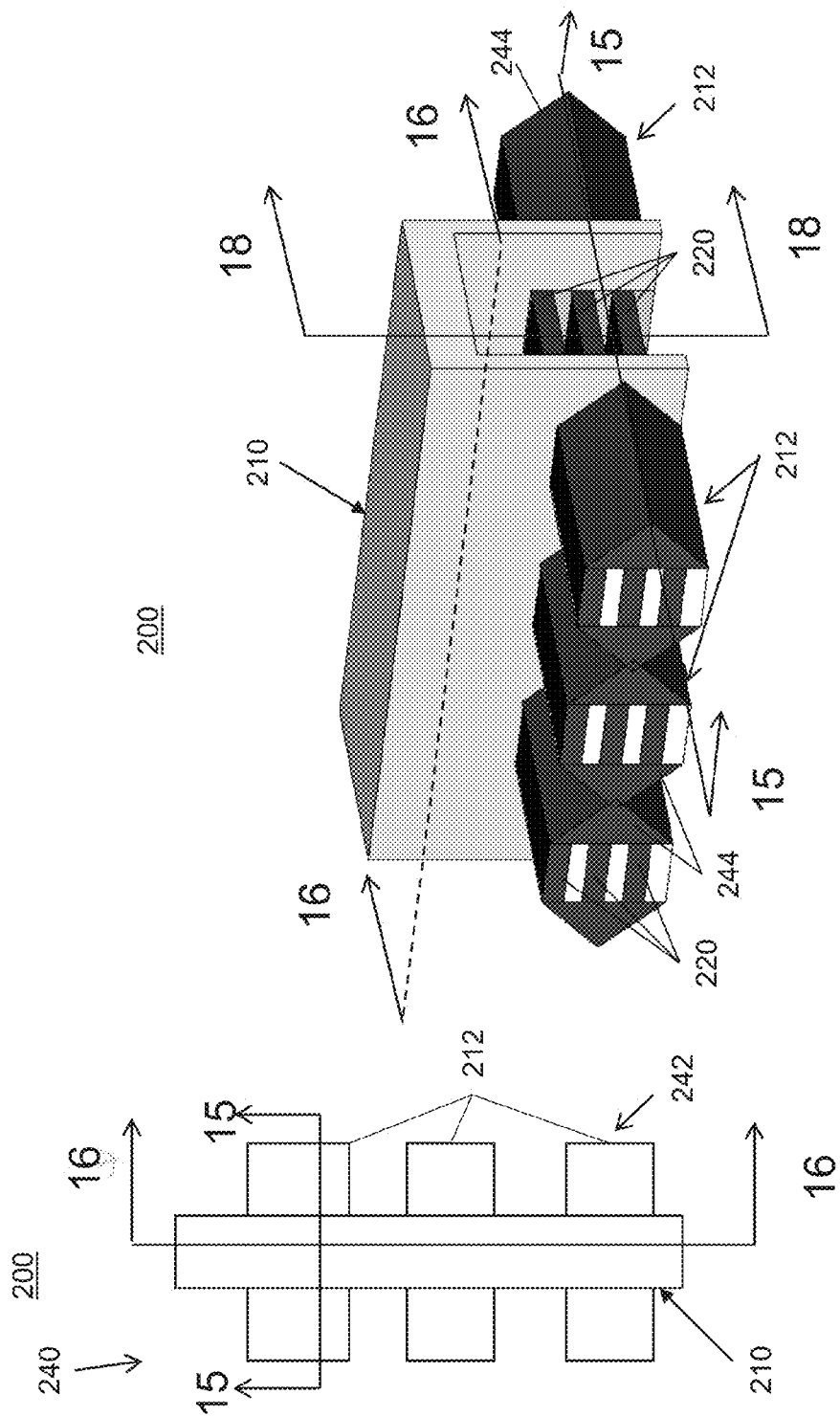
FIG. 13 is a top view showing a gate structure formed over nanosheet fins in accordance with the present principles.
FIG. 14 is a perspective view showing the gate structure of FIG. 13 formed over nanosheet fins in accordance with the present principles.

Referring to FIG. 13, a top view of a gate structure 210 running transversely over fins 212 is shown in accordance with another illustrative embodiment. The nanosheet fins 212 include Si, SiGe, or other semiconductor materials. The gate structure 210 in this example runs over fins 212 and is disposed between the fins 212. The gate structure 210 forms a high-performance device with tight fin pitch and a short gate; however, a similar structure may be employed for greater pitches and longer gates. Source and drain regions are formed in areas 240 and 242, adjacent to the gate structure 210.

Referring to FIG. 14, a perspective view is shown for a finFET device 200. The device 200 includes the gate structure over fins 212. The fins 212 include nanosheets 220 running through the fin 212 and through the gate structure 210. The nanosheets 220 and the gate structure 210 will be shown in greater detail in FIGS. 15-18. Source and drain regions 244 are epitaxially grown on the fins 212 (hexagonally regions). The fins 212 include a nanosheet stack.

Referring to FIG. 15, a cross-sectional view taken at section line 15-15 in FIGS. 13 and 14 is shown in accordance with one illustrative embodiment. The gate structure 210 includes spacers 246 thereon. The gate structure 210 includes a number of stacked nanosheets 220. These layers 220 are separated by spaces 224 between them. These spaces include dielectric layers, work function setting metals, nanosheets, main conductors, etc. depending on the design. The gate structure 210 is formed between source and drain regions 244, which are formed adjacent to the gate structure 210. Source and drain regions 244 may be formed by an epitaxial growth process over end portions of the fins 212.

Figure 18:
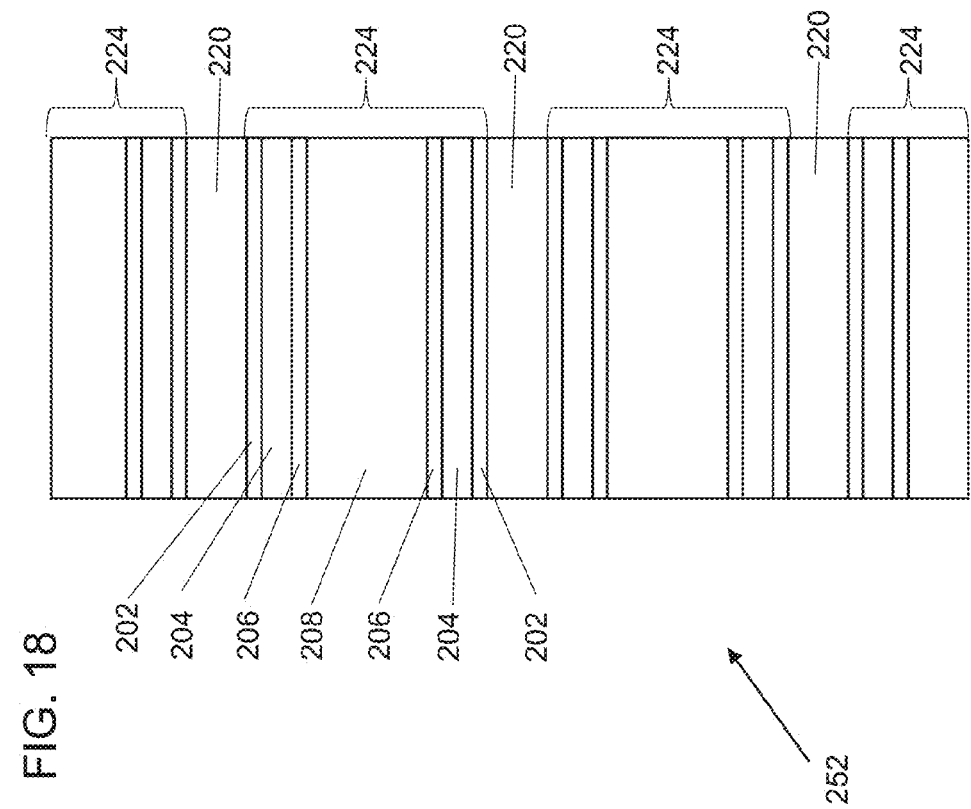
FIG. 18 is a cross-sectional view taken at section line 18-18 of FIGS. 14 and 16 and showing the gate structure of FIG. 15 in greater detail in accordance with the present principles.

Referring to FIG. 16, a cross-sectional view taken at section line 16-16 in FIGS. 13 and 14 is shown in accordance with the illustrative embodiment. The gate structure 210 is shown passing over and in between the fins 212 (stacked nanosheets 220). The gate structure 210 is illustratively shown without a layer stack for simplicity and to show that the gate stack layers are disposed in regions 250 between nanosheets 220. The nanosheets 220 include materials 224 between them as each sheet is assembled, e.g., in a repeating pattern as shown in FIG. 18.

Figure 17:
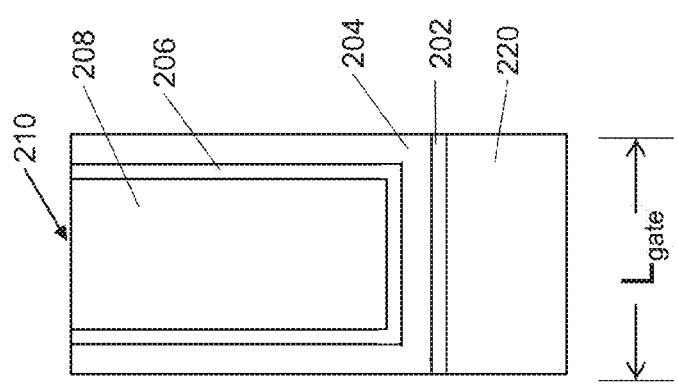
FIG. 17 is a cross-sectional view showing the gate structure of FIG. 15 in greater detail in accordance with the present principles.

Referring to FIG. 17, a cross-sectional view of the gate structure 210 is illustratively shown in greater detail for one embodiment. The gate structure or stack 210 is included between spacers 246 (not shown in FIG. 17). The gate structure 210 is formed on nanosheet 220. The nanosheet 220 includes an interface layer 202, which is grown on or deposited on the nanosheet 220. The interface layer (IL) 202 may include an oxide or an oxynitride. A high-k dielectric material 204 is formed over the IL 202 and over sidewalls (spacers 246, FIG. 15). The high-k dielectric layer 204 and the IL 202 form the gate dielectric for the gate structure 210.

A diffusion barrier layer 206 is formed on the high-k dielectric layer 204. The diffusion barrier may include TiN, although other materials may be employed, such as, e.g., TaN, etc. A work function setting material 208 is formed on the diffusion barrier layer 206. A main conductor (not shown) may be formed on or within the work function setting material 208. The main conductor may include materials, such as W, Al, or other highly conductive materials.

In accordance with the present principles, for narrow-pitch devices, the work function setting material 208 includes TiAlC or TiC doped with Al. The work function setting material 208 works with the diffusion barrier layer 206 to prevent oxygen diffusion in the gate region. By preventing oxygen mobility, the work function setting material remains stable and therefore, the threshold voltage remains stable. The oxygen diffusion resistance provided by the gate structure will be described in greater detail herein.

The gate structure 210 employing the illustrative structure depicted in FIG. 17 provides equivalent or better performance than the TiN/TiAlC/TiN stack (FIG. 10) and includes a reduced gate length ($L_{gate}$).

Referring to FIG. 18, a cross-sectional view taken at section line 18-18 in FIGS. 14 and 16 is shown in accordance with one illustrative embodiment. A region 252 of FIG. 15 shows the cross-section in greater detail. The layers of the gate structure 210 are formed within the fins 212. The gate structure 210 and the fins 212 include the interface layer 202 on each sheet 220. The sheets 220 also include the high-k dielectric material 204, the diffusion barrier layer 206 and the work function setting material 208. These layers 202, 204, 206 and 208 fit between sheets 220 such that a minimum spacing ($Sheet_{space}$) dimension needs to be provided. The $Sheet_{space}$ along with the sheet thickness provides a $Sheet_{pitch}$. As before, higher voltages may need thicker ILs 204. This affects $Sheet_{space}$ and $Sheet_{pitch}$, as described above.

The region 252 includes three nanosheet layers each includes a sheet 220 and its corresponding layers in regions 224. In one example, a stack of nanosheets (252) includes three nanosheets. For the nanosheet stack, $L_{gate}$=13 nm, as before, and nanosheet height (thin dielectric)=52 nm and nanosheet height (thick dielectric)=73 nm in this example. $L_{gate}$=(1.5+1)×2+5=10 nm. This is the same as the finFET or a planar device in accordance with the present principles. The region 252 has a total three-sheet height of 52 nm (6 nm per sheet 220) and for thick (4 nm) dielectric (202)=73 nm high.

Conventional stacks employ two TiN diffusion barriers, which interfere with the thickness dimension (height of the stack), and therefore limit the scalability of the gates and the spacings. The additional TiN layer is needed to prevent oxygen diffusion into the gate and in between the structures since oxygen in these regions has an adverse effect of threshold voltage of field effect transistors formed using these stacks.

The stacks described above employed two TiN diffusion barriers, which interfere with the thickness dimension and therefore the scalability of the gates and the fin-fin spacings, which are the dimensional limitations needed by the known art. The two TiN layers are needed to prevent oxygen diffusion into the gate and in between the fin structures since oxygen in these regions has an adverse effect of threshold voltage of field effect transistors formed using these stacks.

A computation for finFETs with nanosheets in accordance with the present principles provided the following results in Table 2.

TABLE 2

FinFET nanostack layer comparison

| | Dimensions in nm | | | |
| --- | --- | --- | --- | --- |
| | Thin IL (202) | Thick oxide | Thin IL in nanostack with two TiN layers | Thick IL nanostack with two TiN layers |
| $L_{gate}$ | 10 | 10 | 13 | 13 |
| Height for three nanosheets | 52 | 73 | 60 | 81 |

As depicted in Table 2, significant reductions in size were obtained for the nanosheets in accordance with the present principles (with IL 202) over the nanosheets structures with two TiN layers (See e.g., FIG. 10).

Figure 19:
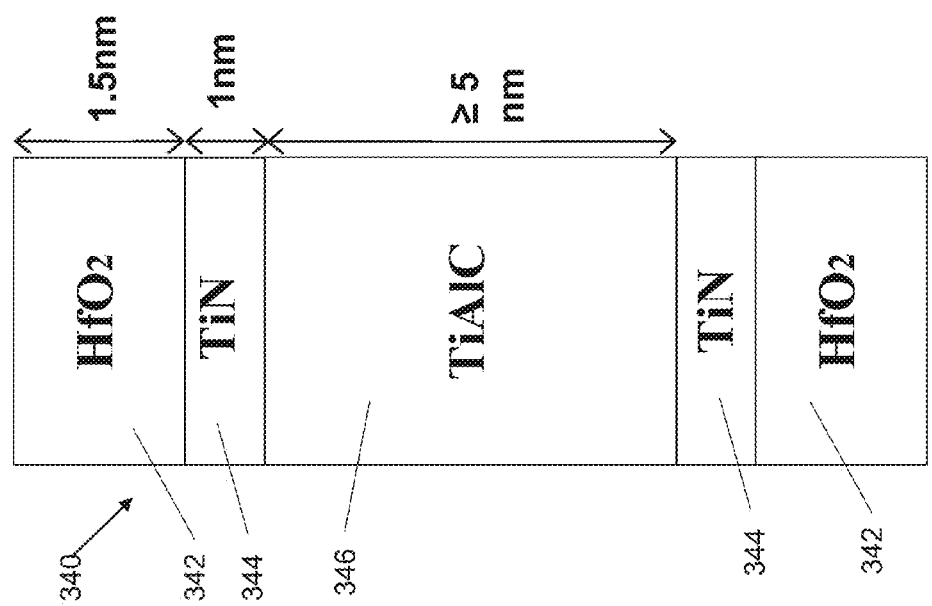
FIG. 19 is a cross-sectional view showing another diffusion barrier structure in accordance with the present principles.

Referring to FIG. 19, an illustrative shared WF-metal configuration 340 may be employed in a gate structure or between FETs, or between any two semiconductor regions to provide a diffusion barrier and conductor system. In one embodiment, the WF gate structure may be employed for a PFET. Region 346 includes TiAlC or TiAlCO (preferably Al-rich) or other high oxygen affinity material to block oxygen diffusion. The TiAlC or TiAlCO of region 346 may include a thickness of greater than about 5 nm and the region 346 has regions 344 including about 1 nm of TiN. High-k dielectric layers 342 may be provided in the diffusion barrier configuration 340. The barrier configuration 340 is effective in preventing oxygen diffusion across the stack.

In one embodiment, the structure 342 may include two semiconducting regions, each with an interfacial oxide (not shown) and high-k dielectric region (342) and a barrier layer (TiN) 344, and a common metal 346. The interfacial oxide may include silicon dioxide or oxynitride of thickness of between about 0.5 nm to about 5 nm. The high-k dielectric 342 may include e.g., $HfO_2$ of thickness of about 1-2 nm. The barrier layers 344 may include TiN of thickness of ~1 nm. The common metal 346 includes TiAlC of 5 nm or more in thickness. The TiAlC includes Al to a concentration between 20% and 40%. The structures 320, 330 and 340 may be employed in gate structures, between semiconductor fins, between semiconductor portions of planar or other types of device, etc. It should be understood that the region 344 is a single TiN layer that runs down below the TiAlC region 346. TiN does not run between portions of the TiAlC region 346. Instead, the TiAlC region 346 runs into the trench on top of the TiN layer 344 and eventually merges with itself to form the TiAlC region 346. The TiAlC region 346 pinches off in the trench or opening.

Figure 20:
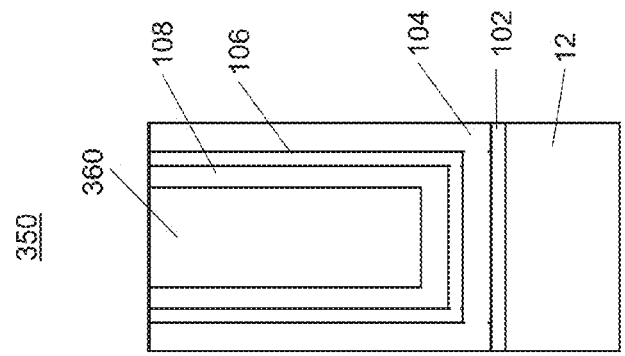
FIG. 20 is a cross-sectional view showing a gate structure in accordance with another embodiment.

It should be understood that other structures may be employed in accordance with the present principles as well. Referring to FIG. 20, a gate structure 350 includes a diffusion barrier 106 and work function setting material 108 and further includes a gate electrode 350. The gate electrode 360 may include a metal such W, Al or other suitable material. The gate metal for electrode 360 may or may not be disposed between the fin structures as described above. The gate electrode 360 may be present in larger node technology devices.

Figure 21:
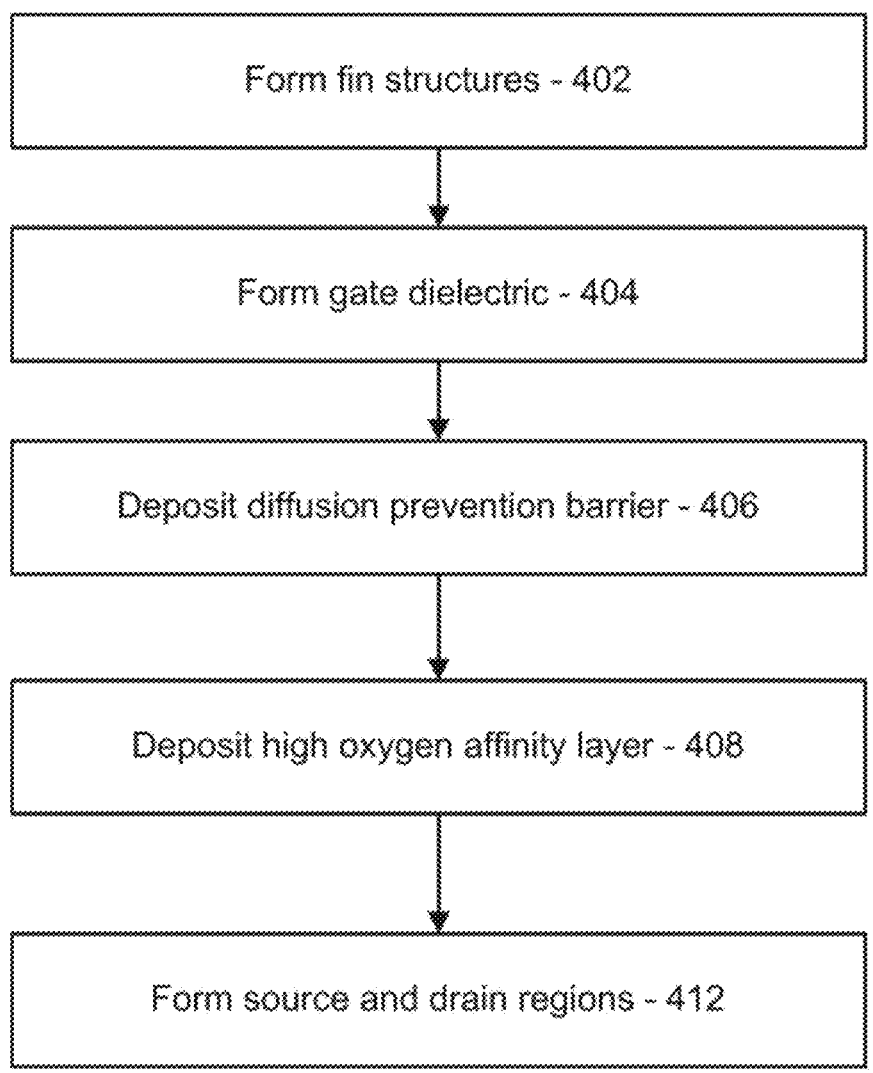
FIG. 21 is a block/flow diagram showing a method for forming a field effect transistor in accordance with one illustrative embodiment.

Referring to FIG. 21, methods for forming a field effect transistor are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 402, fin structures are formed. The fin structures may include semiconductor fins and an interface layer may be formed on the semiconductor fins. The interface dielectric may be formed on semiconductor material as an oxide or oxynitride. The fin structures may include two or more stacked and patterned nanosheets. The nanosheets are patterned to form the fin structures. The nanosheets each include a semiconductor layer, and the semiconductor layers are separated by a high dielectric constant layer, a diffusion prevention layer, and a work function setting layer including an aluminum doped TiC layer having a thickness greater than 5 nm.

In block 404, a gate dielectric layer is formed over and between a plurality of fins depending on the structure. The gate dielectric layer may include in the interface layer and/or a high-k dielectric material such as $HfO_2$. In block 406, a diffusion prevention layer is deposited on the gate dielectric. The diffusion prevention layer includes a TiN layer.

In block 408, a high oxygen affinity layer is formed, e.g., a TiAlC layer. The TiAlC layer may have a thickness greater than 5 nm and is deposited on the diffusion prevention layer. The TiAlC layer is doped with aluminum to provide an aluminum concentration of between about 20% and about 40%. The TiAlC layer is deposited to pinch off and come in contact with itself. In this way, the TiAlC layer merges with itself and avoids the need for an additional TiN layer. In some embodiments, gate structures may include an additional metal (e.g., W, Al, etc.) for the gate conductor.

In block 412, source and drain regions are formed on sides of the gate structure on the plurality of fin structures. Processing continues to complete the device.

The present principles may be included in a plurality of different applications and process flows. In one embodiment, the following process flow may be implemented. For example, fin structures may be created. This may include a solid semiconductor fin or nanosheet formation. A dummy oxide (e.g., 1.0-5.0 nm thick) is formed on a semiconductor substrate. A polysilicon layer is formed and patterned. After device activation, an interlayer dielectric deposition is performed. A polysilicon open step is performed by a chemical mechanical polish (CMP) followed by dummy polysilicon removal. A dummy oxide is patterned (then removed from logic FET area and kept in I/O FET area). A high-k pre-clean is performed on an interface layer formation is performed (logic 0.5-1.0 nm in thickness, I/O 1.0-5.0 nm in thickness). High-k deposition is performed (e.g., 1.5 nm in thickness). Then, TiN deposition (e.g., 1.0 nm in thickness). Then, TiAlC deposition is performed (in-situ doping) (with thickness >2.5 nm, until fin-fin or nanosheet-nanosheet space is pinched off). A liner metal (e.g., TiN) may be deposited (e.g., 2.0 nm). A gap fill metal (e.g., W or Al) may be deposited. The gap metal fill is planarized (e.g., by CMP). Then, the process continues with a CMOS flow.

Having described preferred embodiments for stable work function for narrow-pitch devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A work function setting metal stack, comprising:
    a configuration of layers including
        a high dielectric constant layer;
        a diffusion prevention layer formed on the high dielectric constant layer; and
        an aluminum doped TiC layer having a thickness greater than 5 nm, wherein the configuration of layers is employed between two regions as a diffusion barrier to prevent mass diffusion between the two regions.

2. The stack as recited in claim 1, wherein the two regions include semiconductor regions.

3. The stack as recited in claim 2, further comprising an interface layer formed on the semiconductor regions.

4. The stack as recited in claim 2, wherein the semiconductor regions include adjacent fins for fin field effect transistors.

5. The stack as recited in claim 1, wherein the diffusion barrier is formed as a gate structure for a field effect transistor.

6. The stack as recited in claim 1, wherein the diffusion prevention layer includes a TiN layer.

7. The stack as recited in claim 1, wherein the aluminum doped TiC layer is pinched off to merge with itself between the two regions.

8. The stack as recited in claim 1, wherein the aluminum doped TiC layer includes an aluminum concentration of between about 20% and about 40%.

* * * * *